United States Patent
Korenaga et al.

(10) Patent No.: US 8,016,974 B2
(45) Date of Patent: Sep. 13, 2011

(54) PLASMA TREATMENT APPARATUS

(75) Inventors: Tetsuo Korenaga, Saga (JP); Ryuji Nagadome, Fukuoka (JP)

(73) Assignee: Panasonic Corporation, Osaka (JP)

( * ) Notice: Subject to any disclaimer, the term of this patent is extended or adjusted under 35 U.S.C. 154(b) by 1194 days.

(21) Appl. No.: 10/593,385

(22) PCT Filed: Feb. 10, 2006

(86) PCT No.: PCT/JP2006/302780
§ 371 (c)(1),
(2), (4) Date: Sep. 18, 2006

(87) PCT Pub. No.: WO2006/088114
PCT Pub. Date: Aug. 24, 2006

(65) Prior Publication Data
US 2008/0251208 A1  Oct. 16, 2008

(30) Foreign Application Priority Data
Feb. 15, 2005 (JP) .................................. 2005-037153

(51) Int. Cl.
*C23F 1/00* (2006.01)
*C23C 16/00* (2006.01)
(52) U.S. Cl. ......... 156/345.31; 156/345.43; 156/345.54; 118/719
(58) Field of Classification Search .................. 118/718, 118/719; 156/156, 345.31, 345.32
See application file for complete search history.

(56) References Cited

U.S. PATENT DOCUMENTS

| 4,588,185 A | * | 5/1986 | Shoda et al. | ............ 271/267 |
| 5,443,689 A | | 8/1995 | Kimura et al. | |
| 5,823,416 A | | 10/1998 | Haji | |
| 6,093,904 A | | 7/2000 | Haji | |

FOREIGN PATENT DOCUMENTS

| EP | 1 355 342 A2 | 10/2003 |
| JP | 06-3928 | 1/1991 |
| JP | 03-51733 | 5/1991 |
| JP | 03-51733 A | 5/1991 |
| JP | 09-63916 | 3/1997 |
| JP | 10-029714 | 2/1998 |
| JP | 10-140376 | 5/1998 |
| JP | 10-223725 | 8/1998 |
| JP | 11-289192 | 10/1999 |
| JP | 2000212777 A * | 8/2000 |
| JP | 2001-358122 | 12/2001 |
| JP | 2002-240921 | 8/2002 |

OTHER PUBLICATIONS

JP Office Action 2005-037153, Jul. 18, 2008.

* cited by examiner

*Primary Examiner* — Karla Moore
(74) *Attorney, Agent, or Firm* — Pearne & Gordon LLP

(57) ABSTRACT

In a plasma treatment apparatus for performing plasma treatment by accommodating a substrate in a treatment chamber, a fixed guide 12 and a movable guide 13 made of a ceramic are arrayed in an X direction (in a substrate transporting direction) for guiding both side end portions of the substrate held on a ceramic-made mounting plate 10, and both end portions of the movable guide 13 are supported by supporting members. In this construction, these supporting members are fitted to fixed members 15A and 15B arranged in a Y direction with the mounting plate 10 placed therebetween, such that an interval in the Y direction is adjustable. Consequently, the ceramic-made guide member 13 can be mounted and demounted without directly bolting it, and it is possible to prevent the generation of an abnormal discharge by using as objects multiple product thin-type substrates with different widthwise dimensions.

3 Claims, 8 Drawing Sheets

PLASMA TREATMENT APPARATUS

TECHNICAL FIELD

The present invention relates to a plasma treatment apparatus for performing plasma treatment by using a substrate as an object.

BACKGROUND ART

Plasma treatment is known as a surface treatment method such as the cleaning and etching of a substrate on which electronic parts are mounted. In this plasma treatment, surface treatment such as cleaning is carried out by the etching action of plasma which is generated by mounting a substrate in a treatment chamber in a reduced-pressure atmosphere and by causing plasma discharge to take place in the treatment chamber. A substrate guide mechanism is provided for guiding the substrate during its carrying-in and carrying-out and for holding the substrate in a proper position and attitude during plasma treatment (e.g., refer to Japanese patent publications JP-A-10-140376 and JP-A-10-223725).

In JP-A-10-140376, a side end surface of the substrate is guided by a bar-shaped guide member arranged in a substrate transporting direction, and the mounting position of the guide member is changed in correspondence with the widthwise dimension of the substrate which serves as the object. In addition, in JP-A-10-223725, an electrode which also serves as a mounting portion on which the substrate is mounted is fabricated in a shape capable of guiding a side end portion of the substrate, and each time the substrate serving as the object is changed, the mounting portion is replaced in conformity with the substrate.

In recent years, resin substrates have come to be increasingly used as mounting substrates. Since the resin substrate is thin and deflectable, the resin substrate has a characteristic that a gap can possibly be formed between the resin substrate and the electrode with the resin substrate mounted thereon, so that a malfunction such as an abnormal discharge is likely to occur. For this reason, in a plasma treatment apparatus using such a resin substrate as an object, an arrangement has come to be used in which an upper surface of the electrode on which the substrate is mounted is covered with a material which is difficult to generate a discharge, such as a ceramic for the purpose of preventing the abnormal discharge.

However, in the plasma treatment apparatus having the arrangement in which the upper surface of the electrode is thus covered with the ceramic, if the substrate guide mechanism such as the one described above is adopted, the following malfunction is encountered. Namely, if a ceramic guide body is attached by bolting on each such occasion, since the ceramic is an extremely brittle and a breakable material, the guide member is easily broken at the bolted portions and cannot withstand repeated use, so that this arrangement is difficult to be adopted in practical use.

In addition, if the method shown in the patent document 2 is adopted, a ceramic-made mounting portion must be prepared for each kind of substrate, so that a rise in the running cost is unavoidable. Thus, in the conventional plasma treatment apparatuses, there has been a problem in that in the case where a thin-type substrate such as a resin substrate is used as an object, it is difficult to realize a substrate guide mechanism which is effectively capable of preventing an abnormal discharge.

DISCLOSURE OF INVENTION

Accordingly, an object of the invention is to provide a plasma treatment apparatus which is capable of preventing the occurrence of an abnormal discharge by using a thin-type substrate as an object.

The plasma treatment apparatus in accordance with the invention is a plasma treatment apparatus for plasma treating a surface of a substrate by accommodating the substrate in a treatment chamber, comprising: a base portion for forming a bottom portion of the treatment chamber; an electrode section which is fitted on the base portion through an insulator and whose upper surface is exposed in the treatment chamber; a substrate mounting portion which constitutes an upper portion of the electrode section and whose upper surface is covered with a ceramic; plasma generating means for generating plasma for plasma treatment in the treatment chamber; a plurality of bar-shaped ceramic-made guide members which are disposed on the upper surface of the substrate mounting portion along a substrate transporting direction and are adapted to guide side end surfaces of the substrate mounted on the substrate mounting portion; and guide member holding means for holding longitudinal both end portions of the guide members at a predetermined interval, wherein the guide member holding means includes a pair of fixed members which are fixedly disposed on the base portion in a transverse direction at a right angle to the substrate transporting direction along outer edges of the substrate mounting portion, a plurality of supporting members whose position in the substrate transporting direction is positioned by the fixed members and which are adapted to support the both end portions of the guide members, and fitting means for fitting the plurality of supporting members to the fixed members such that the interval in the transverse direction is adjustable.

According to the invention, as a guide mechanism for guiding the side end surfaces of the substrate on the substrate mounting portion whose upper surface is covered with the ceramic, the both end portions of the bar-shaped ceramic-made guide members arranged on the substrate mounting portion in a plurality of rows in the substrate transporting direction are supported by the supporting members. The arrangement provided is such that the supporting members are fitted to the fixed members fixedly disposed along the substrate mounting portion at a right angle to the substrate transporting direction, such that the interval is adjustable. By adopting this arrangement, it is possible to prevent the generation of an abnormal discharge by using as objects multiple product thin-type substrates with varying widthwise dimensions.

BEST MODE FOR CARRYING OUT THE INVENTION

Next, a description will be given of an embodiment of the invention with reference to the drawings.

Figure 1:
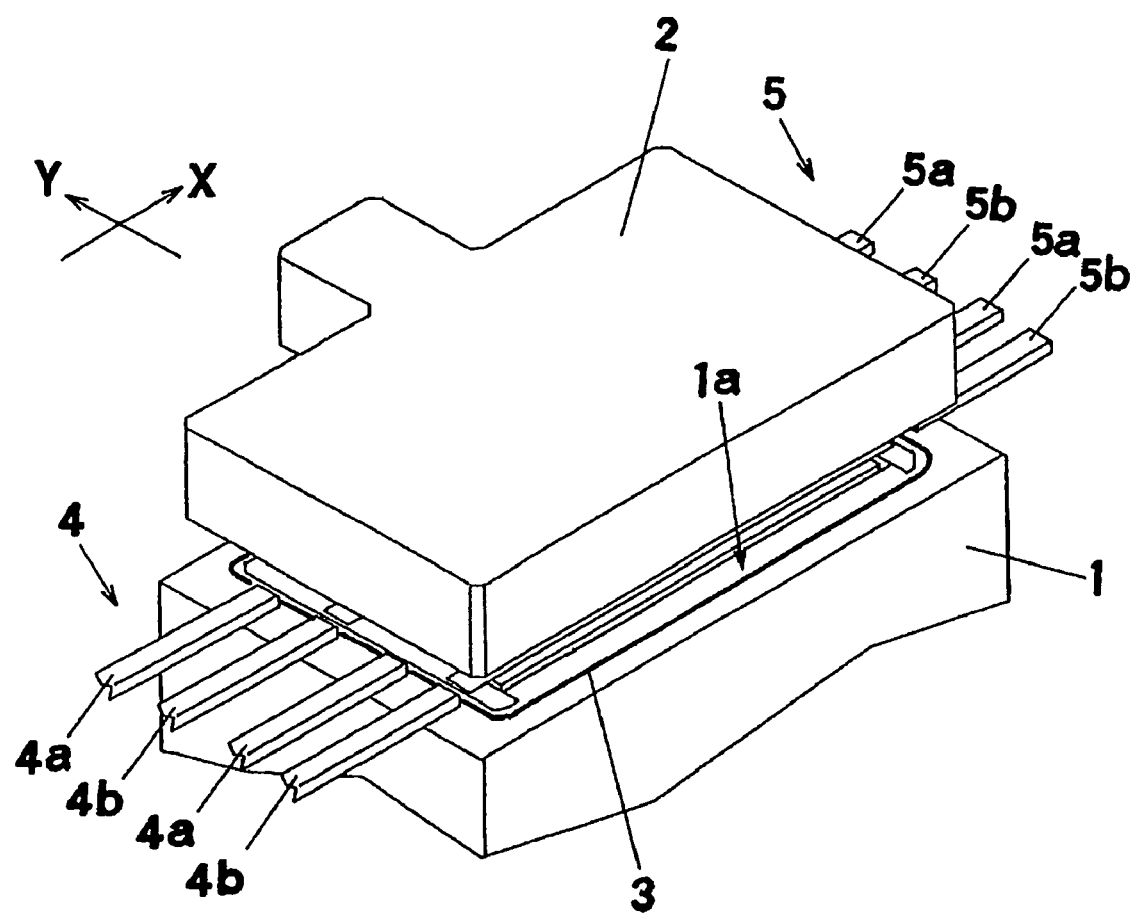
FIG. 1 is a perspective view of a plasma treatment apparatus in accordance with an embodiment of the invention.

First, a description will be given of the structure of the plasma treatment apparatus with reference to FIGS. 1, 2, and 3. In FIG. 1, a cover member 2 is disposed above a base portion 1 in such a manner as to be capable of being raised or lowered by a raising/lowering mechanism (not shown). The cover member 2 is a box-shaped member with its lower surface side open, and as the cover member 2 is lowered, and a lower end portion 2a abuts against a base surface 1a on top of the base portion 1, a treatment chamber 6 for plasma treatment is formed. Namely, the base portion 1 forms a bottom portion of the treatment chamber, and the substrate subject to treatment is accommodated in the treatment chamber 6 to effect the plasma treatment of the surface of this substrate. A seal member 3 is fitted to a portion of the base surface 1a where the lower end portion 2a abuts, and as the abutment surface of the lower end portion 2a is pressed against the seal member 3, the vacuum tightness of the interior of the treatment chamber 6 is ensured.

A substrate carrying-in section 4 and a substrate carrying-out section 5 are respectively disposed on the upstream side and the downstream side of the base portion 1. The substrate carrying-in section 4 is for carrying the substrate subject to treatment into the treatment chamber 6 from an upstream side, while the substrate carrying-out section 5 is for carrying out the treated substrate from the treatment chamber 6 to a downstream side. Each of the substrate carrying-in section 4 and the substrate carrying-out section 5 two rows of transport conveyor mechanisms each consisting of a pair of transport rails 4a and 4b or transport rails 5a and 5b, so that two substrates can be transported in parallel.

Here, each of the transport rails 4b and 5b is movable in a Y direction (in a transverse direction at a right angle to the substrate transporting direction). The arrangement provided is such that as the conveyor width of the transport conveyor is changed by moving the transport rails 4b and 5b by a conveyor width narrowing mechanism (not shown), substrates can be transported by using as objects multiple product substrates having different widthwise dimensions.

Figure 2:
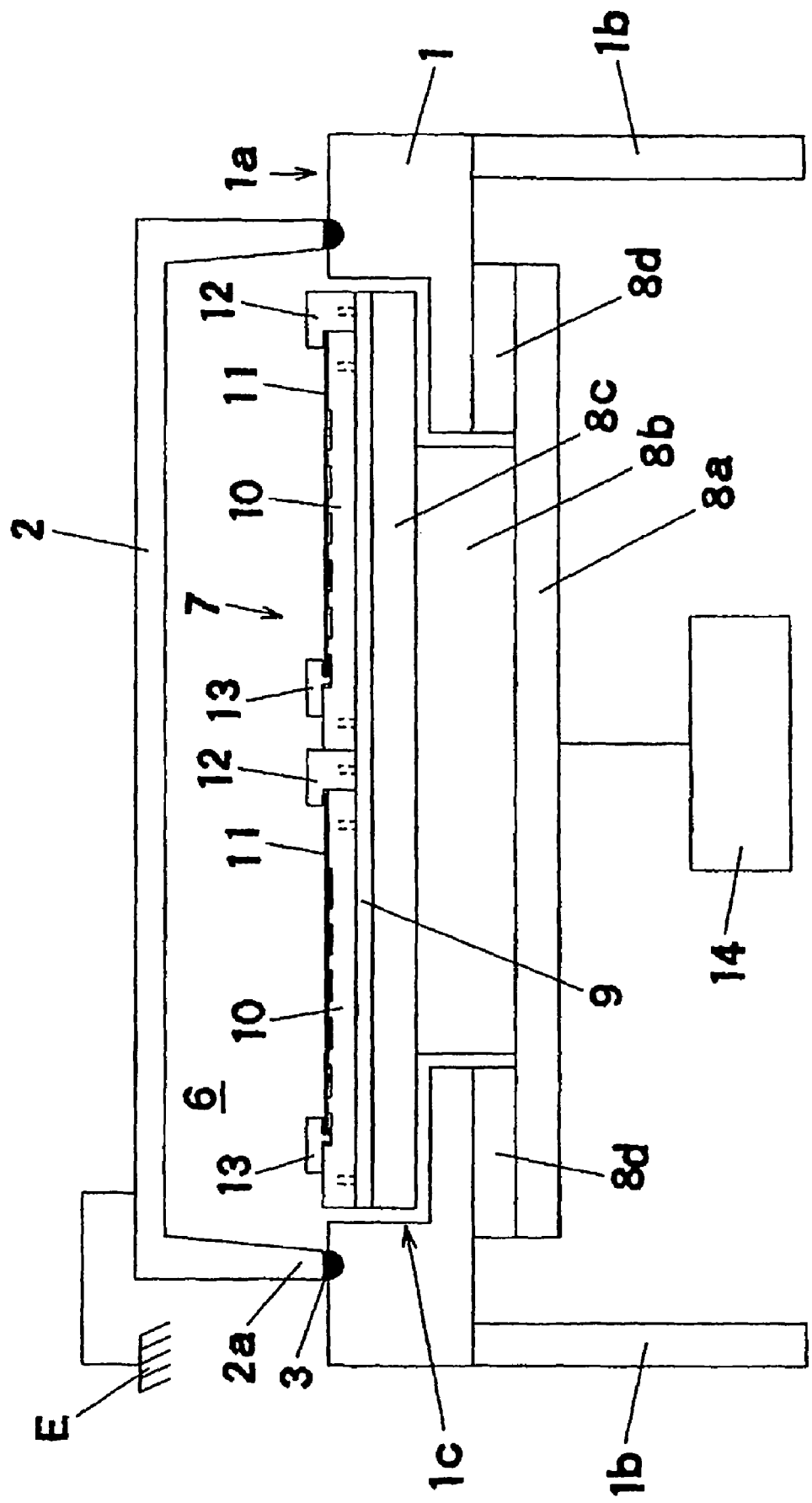
FIG. 2 is a cross-sectional view of the plasma treatment apparatus in accordance with the embodiment of the invention.
Figure 3:
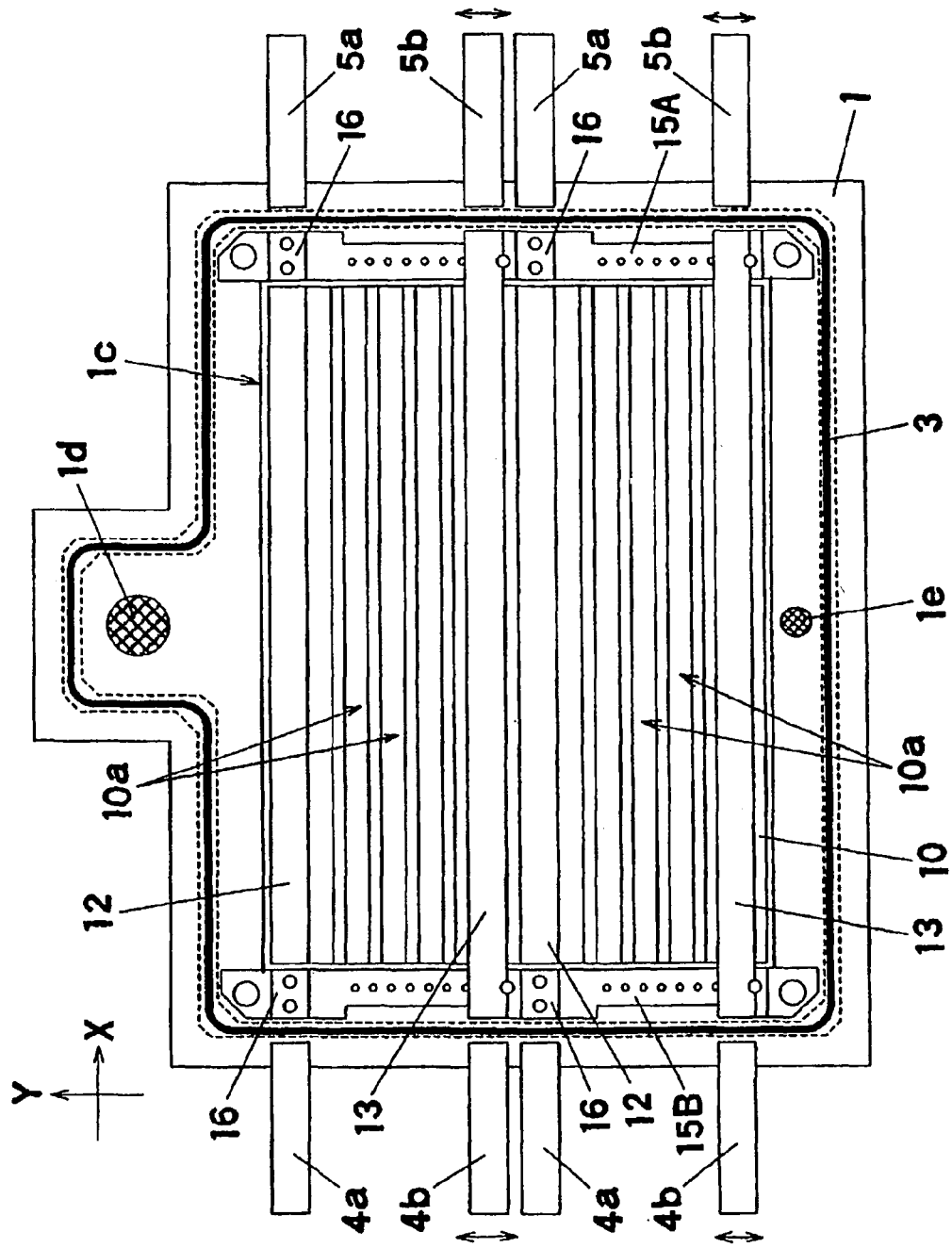
FIG. 3 is a plan view of a base portion of the plasma treatment apparatus in accordance with the embodiment of the invention.

As shown in FIG. 2, the base portion 1 has its both ends supported by legs 1b, and an opening 1c which is open in the base surface 1a is provided in the base portion 1 (see FIG. 3 as well). An electrode section 7 for generating a plasma discharge in the treatment chamber 6 is fitted in the opening 1c. The electrode section 7 is constructed such that a substrate mounting portion for holding a substrate 11 is installed on an upper surface of a conductive portion in which three conductive members 8a, 8b, and 8c made of an electrically conductive metal such as aluminum are superposed one on top of another. The electrode section 7 is installed on the base portion 1 by securing the conductive member 8c to a lower surface of the base portion 1 through an insulating member 8d. In this state, the substrate-mounting portion on the upper surface side is exposed in the treatment chamber 6.

The substrate mounting portion is so constructed that two ceramic-made mounting plates 10, on which the substrates 11 subject to treatment are mounted, are juxtaposed on an insulating member 9 similarly made of a ceramic. As the insulating member 9 is fixed and fitted on an upper surface of the conductive member 8c, the substrate mounting portion is installed on the conductive portion. Namely, the arrangement provided is such that the substrate-mounting portion constitutes an upper portion of the electrode section 7 and is covered by the ceramic.

A plurality of groove portions 10a are formed on the upper surfaces of the two mounting plates 10 by respectively cutting substrate mounting surfaces in an X direction (see FIGS. 3 and 4), and each substrate 11 is mounted in such a manner as to cover the groove portions 10a. The groove portions 10a function as fitting-in portions for allowing lower end portions of transport claws of a substrate transport mechanism (not shown) to fit into them when the transport claws are abutted against end faces of the substrate to transport the substrate. Also, the groove portions 10a function as fitting grooves when a movable guide 13, which will be described below, is placed and fitted on the mounting plate 10, as will be described later.

Figure 4:
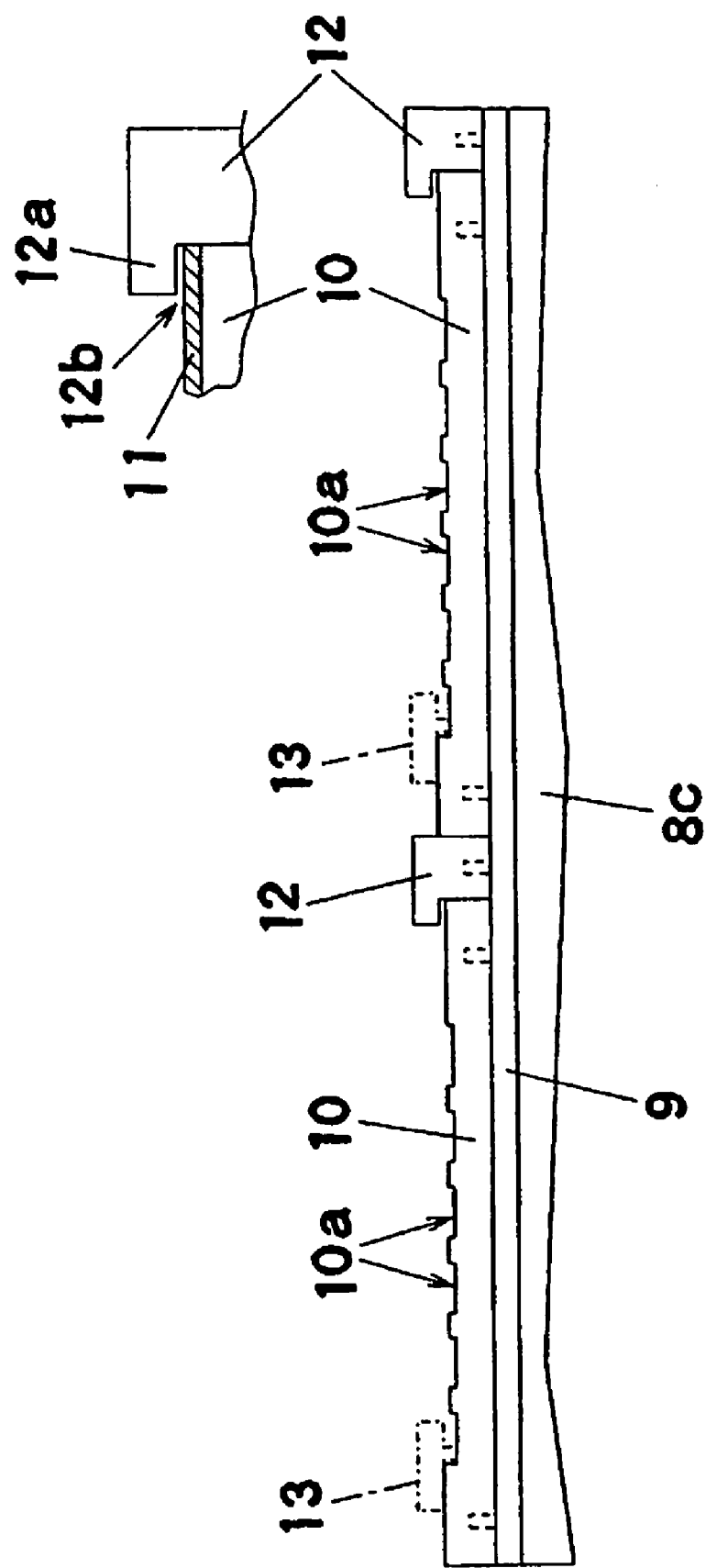
FIG. 4 is a partial cross-sectional view of the plasma treatment apparatus in accordance with the embodiment of the invention.

The substrate 11 which is subject to treatment is a thin-type resin substrate, and since it is easily deflected and undergoes warpage deformation, both side end portions of the substrate 11 are guided at its side surfaces and its upper surface by a fixed guide 12 and the movable guide 13 which are respectively arranged in the X direction. The fixed guide 12 is an elongated bar-shaped member made of a ceramic, and is disposed by being fixed to the insulating member 9 at a position along one side end surface of the mounting plate 10. As shown in FIG. 4, an extended portion 12a which extends in the transverse direction is provided in an upper portion of the fixed guide 12, and as the side end portion of the substrate 11 is advanced into a guide gap 12b which is formed between a lower surface of the extended portion 12a and an upper surface 10b of the mounting plate 10, an upper surface and a side surface of the side end portion of the substrate 11 is guided.

Figure 5A:
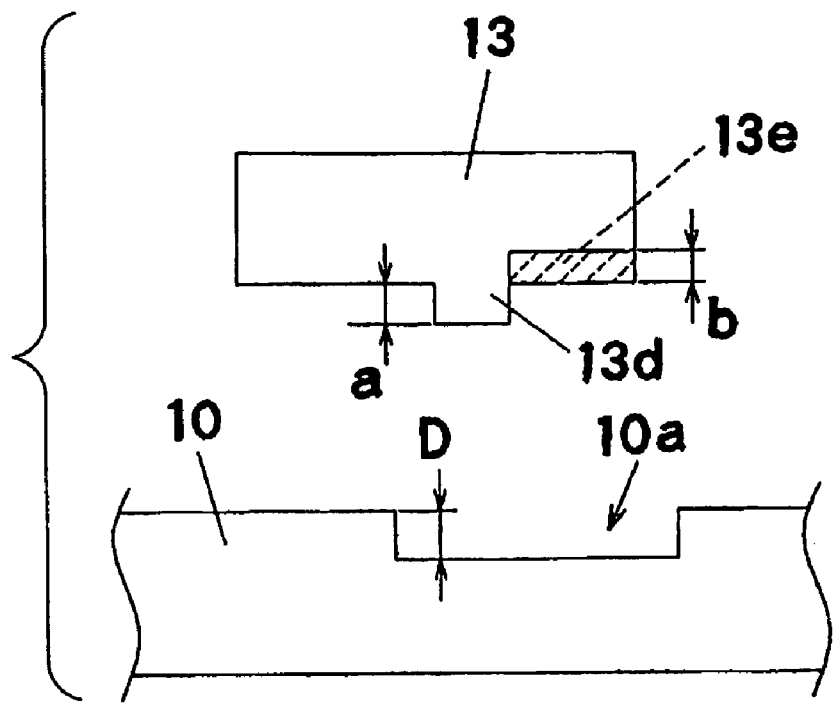
FIGS. 5A and 5B are partial cross-sectional views of a substrate mounting portion of the plasma treatment apparatus in accordance with the embodiment of the invention.
Figure 5B:
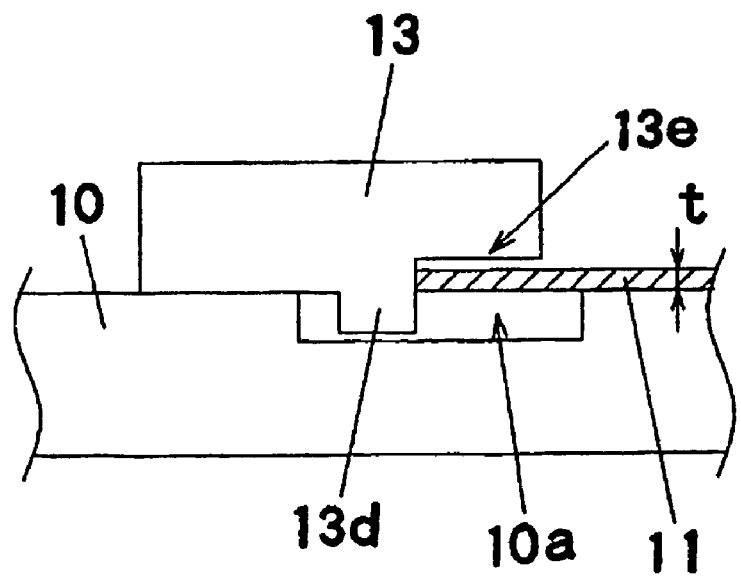

The movable guide 13 is an elongated rectangular bar-shaped member similarly made of a ceramic, and is movable on the mounting plate 10 in the Y direction (in the transverse direction at a right angle to the substrate transporting direction). By moving the position of the movable guide 13 in the transverse direction, it is possible to change the guide width, i.e., the interval between the fixed guide 12 and the movable guide 13, in correspondence with the multiple product substrate 11 with a varying widthwise dimension. FIGS. 5A and 5B show a cross section of the movable guide 13. As shown in FIG. 5A, a projecting portion 13d projecting from a bottom 13f and a notched portion 13e formed by notching the bottom 13f are provided on the bottom 13f of the movable guide 13 in such a manner as to continue in the longitudinal direction.

A projecting dimension a of the projecting portion 13d is set to be smaller than a depthwise dimension D of the groove portion 10a formed in the base portion 1. As a result, as shown in FIG. 5B, the projecting portion 13d does not interfere with the bottom of the groove portion 10a when the movable guide 13 is placed on the upper surface of the mounting plate 10 in a state in which the projecting portion 13d is located in the groove portion 10a and the bottom 13f and the upper surface 10b of the mounting plate 10 are brought into contact with each other.

The notched portion 13e is provided by notching the bottom of the movable guide 13 with a notching dimension b which is larger than the widthwise dimension of the substrate 11. As shown in FIG. 5B, the upper surface and the side surface of the side end portion of the substrate 11 are guided as the side end portion of the substrate 11 is advanced into the notched portion 13e in a state in which the movable guide 13 is placed on the mounting plate 10. Namely, in the state in which the projecting portion 13d is advanced into the groove portion 10a, and the guide member 13 is placed on the substrate mounting surface, the side end portion of the substrate 11 mounted on the substrate mounting surface is guided by the notched portion 13e. At this juncture, the gap (abutment surfaces) between the lower end of the projecting portion 13d and the bottom of the groove portion 10a is located at a position lower than the upper surface 10b of the mounting plate 10, there is no possibility of the occurrence of the trouble that the side end portion of the substrate 11 being transported is fitted into the gap between the abutment surfaces.

In the above-described construction, a plurality of fixed guides 12 and movable guides 13 are disposed on the upper surface of the substrate mounting portion along the substrate transporting direction, and are bar-shaped ceramic-made guide members for guiding the side end surfaces of the substrate 11 mounted on the substrate mounting portion. It should be noted that, in the example shown in FIGS. 5A and 5B, an example is shown in which the range of cutting the bottom of the movable guide 13 is up to the position of the end face of the projecting portion 13d, but the cutting range may be smaller than the same.

In the plasma treatment operation, after the substrates 11 are respectively carried onto the mounting plates 10 by the substrate carrying-in section 4, the cover member 2 is lowered to bring its lower end portion 2a into close contact with the seal member 3, the interior of the treatment chamber 6 is evacuated by an evacuation apparatus (not shown) through an evacuation port 1d (see FIG. 2), and a plasma generating gas is then supplied into the treatment chamber 6 through a gas supplying port 1e (see FIG. 2). Subsequently, as a high-frequency voltage is applied by a high-frequency power supply unit 14 across the electrode section 7 and the cover member 2 which is electrically connected to a grounding portion E, plasma is generated in the treatment chamber 6, and plasma treatment such as etching is performed on the surfaces of the substrates 11 by the action of this plasma. The evacuation apparatus, a plasma gas supplying apparatus, and the high-frequency power supply unit 14 constitute plasma generating means for generating the plasma for plasma treatment in the treatment chamber 6.

In this plasma treatment, since the substrate 11 which is a thin-type resin substrate and is deflectable is used as the object, a gap is liable to be produced between the substrate 11 and the substrate mounting surface, and there is a possibility of an abnormal discharge taking place due to this gap. Even in the case where the substrate 11 having such characteristics is used as the object, in this embodiment, since all of the insulating member 9, the placing plate 10, the fixed guide 12, and the movable guide 13 are ceramic-made members, an abnormal discharge is unlikely to occur during plasma treatment, and it is possible to prevent a defect in the quality of plasma treatment ascribable to the abnormal discharge.

As shown in FIG. 3, a first fixed member 15A and a second fixed member 15B of a symmetrical shape with respect to each other in the X direction (the two members will be generally referred to as the fixed members 15A and 15B in cases where they are not distinguished,) are fixed on the base surface 1a in the Y direction at positions included in the treatment chamber 6 (on the inner side of the seal member 3) on the carrying-out side and the carrying-in side of the mounting plate 10. The first fixed member 15A is fixedly disposed on the base portion 1 on the substrate carrying-in section 4 at a right angle to the substrate transporting direction, while the second fixed member 15B is similarly fixedly disposed on the base portion 1 on the substrate carrying-out section 5.

Figure 6:
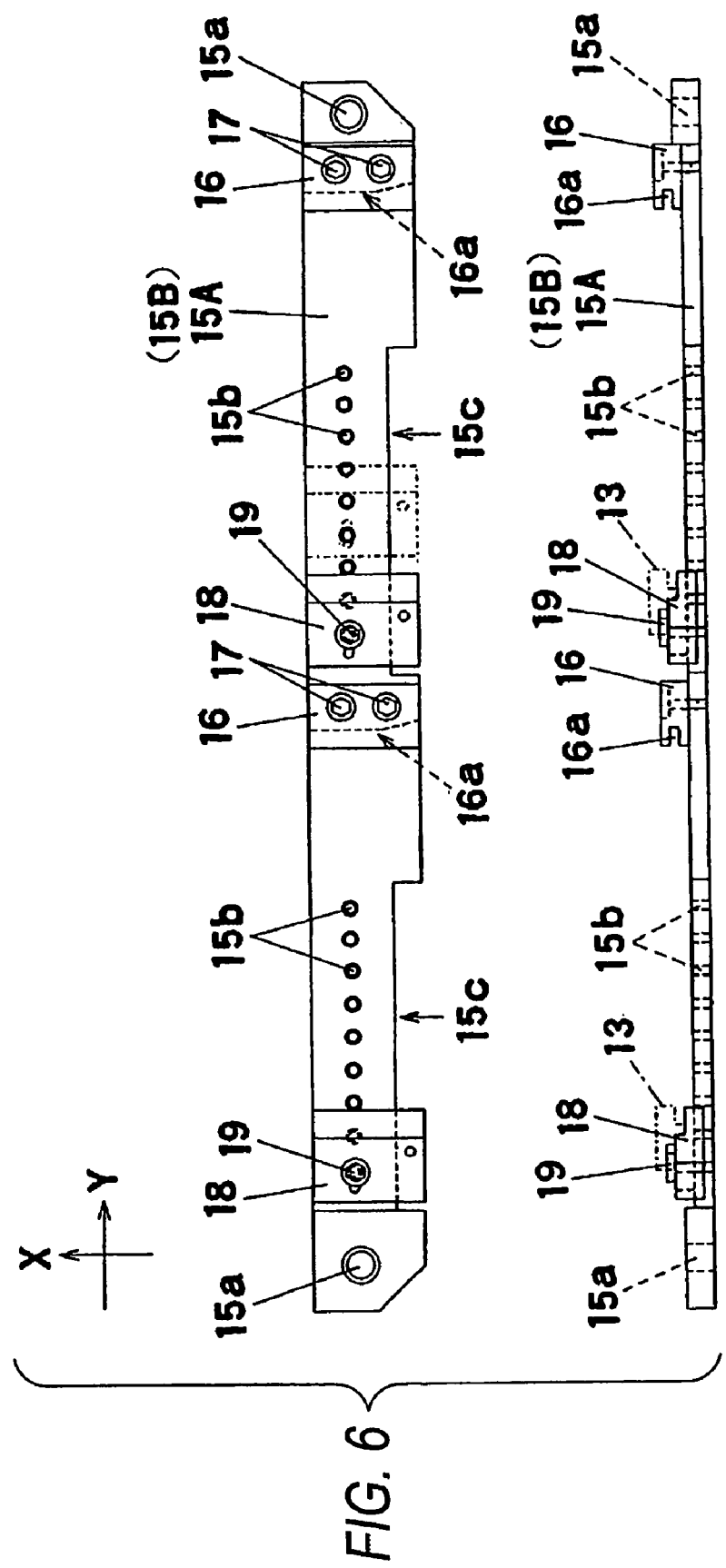
FIG. 6 is a diagram explaining the structure of a fixing member of the plasma treatment apparatus in accordance with the embodiment of the invention.

The fixed members 15A and 15B are formed of a metal which is easy to machine. Metallic guide members 16 are fixed in the fixed members 15A and 15B by bolts 17 at positions respectively corresponding to the transport rails 4a and 5a (see FIG. 6). As a result, both end portions of the fixed guide 12 disposed on one side surface of the mounting plate 10 and the transport rails 4a and 5a are coupled (relayed) by the guide members 16. Namely, as shown in FIG. 6, a guide groove 16a for allowing a side end surface of the substrate 11 to enter therein is provided in a side surface of the guide member 16. The substrate 11 which is carried in by the substrate carrying-in section 4 has its side surface guided as its side end surface advances into the guide groove 16a, is further guided by the fixed guide 12, as described above, and reaches the mounting position on the mounting plate 10.

In addition, both end portions of the movable guide 13 placed on the upper surface of the mounting plate 10 extend on the fixed members 15A and 15B at positions corresponding to the transport rails 4b and 5b. As shown in FIG. 6, the movable guide 13 is held by a metallic supporting member 18 fastened by a bolt 19 to the upper surface of each of the fixed members 15A and 15B. The fixed members 15A and 15B are fixed to the upper surface of the base surface 1a by bolts 15a provided in both end portions thereof.

Each of the fixed members 15A and 15B has a plurality of threaded holes 15b for the fastening of the bolt 19 which are provided at equal pitches in the Y direction. The arrangement provided is such that by changing the threaded hole 15b subject to the fastening by the bolt 19, it is possible to change the position of the supporting member 18 in the Y direction, i.e., the position of the movable guide 13 in the Y direction. Each of the fixed members 15A and 15B is provided with a fitting positioning surface 15c for positioning the supporting member 18 in the X direction, and as a positioning surface 18a (see FIG. 7) provided on the supporting member 18 is aligned (abutted against) along the fitting positioning surface 15c, the supporting member 18 is positioned in the X direction. Namely, the fixing members 15A and 15B has the positioning function for positioning the supporting member 18 in the X direction. It should be noted that, as a structure for realizing this positioning function, it is possible to use another structure such as the one which makes use of a recess/projection fitting of a groove.

Figure 7:
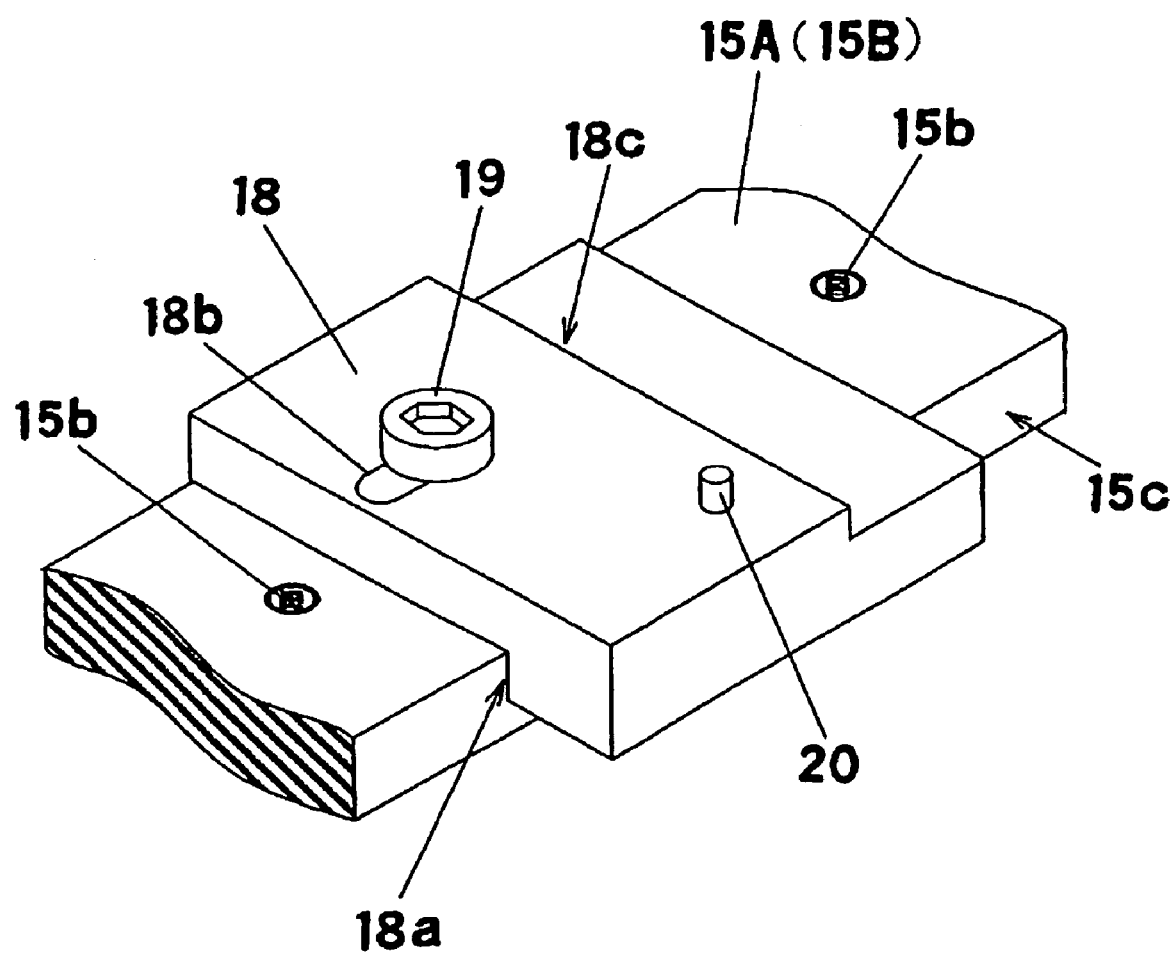
FIG. 7 is a perspective view of a supporting member for supporting a guide member in the plasma treatment apparatus in accordance with the embodiment of the invention.

FIG. 7 shows a state in which the supporting member 18 is fitted to the fixing member 15A (15B), and in the state in which the positioning surface 18a is aligned along the fitting positioning surface 15c, the bolt 19 is inserted in an attaching elongated hole 18b and is threaded engaged with the threaded hole 15b. The position of the supporting member 18 in the Y direction can be adjusted by selecting an optimal position among the threaded holes 15b arranged at equal pitches and within the range of the elongated hole allowance of the attaching elongated hole 18b. The supporting member 18 is provided with a fitting stepped portion 18c and a positioning pin 20 for supporting the movable guide 13.

Figure 8A:
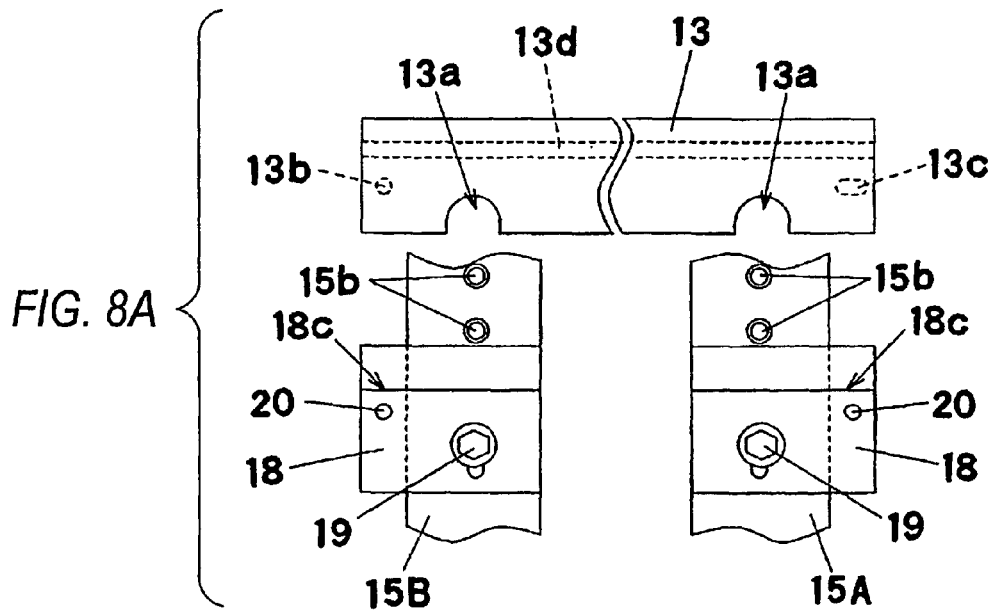
FIGS. 8A and 8B are diagrams explaining a method of placing the guide member in the plasma treatment apparatus in accordance with the embodiment of the invention.
Figure 8B:
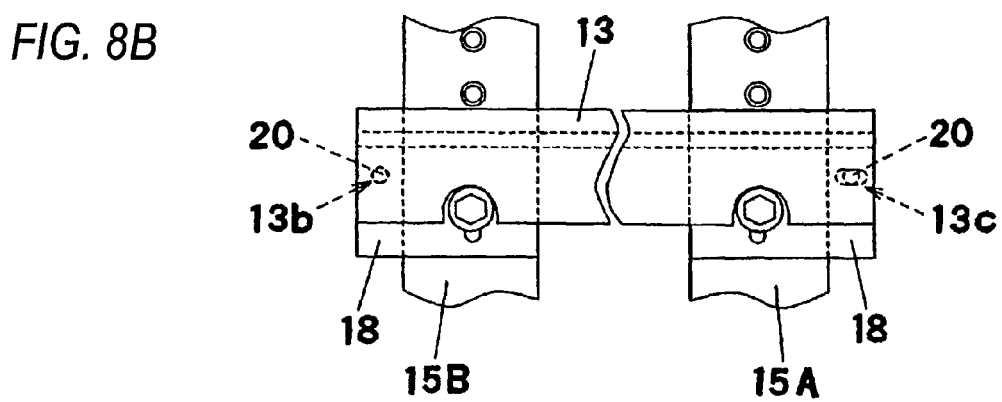

When the movable guide 13 is fitted, both end portions of the movable guide 13 are positioned with respect to the supporting members 18 fitted to the fixed members 15A and 15B, as shown in FIG. 8A. Namely, notched portions 13a provided in the movable guide 13 are adjusted to the positions of the bolts 19, and the positioning pins 20 provided on the supporting members 18 are respectively positioned to a positioning hole 13b and a positioning elongated hole 13c of the movable guide 13. Then, as shown in FIG. 8B, the movable guide 13 is lowered onto the supporting members 18 from above, and while the projecting portion 13d is being aligned along the fitting stepped portion 18c, the positioning pins 20 are respectively fitted in the positioning hole 13b and the positioning elongated hole 13c.

As a result, the movable guide 13 is supported by the supporting members 18 from below, and is placed on the supporting members 18 by its own weight without effecting bolting. In this placed state, the position of the movable guide 13 is properly held without being positionally offset in both the X direction and the Y direction as the positioning pins 20 are fitted in the positioning hole 13b and the positioning elongated hole 13c, and as the projecting portion 13d is aligned along the fitting stepped portion 18c.

In the above-described construction, the fixing members 15A and 15B and the supporting members 18 constitute guide member holding means for holding longitudinal both end portions of the movable guide 13 at a predetermined interval. Namely, this guide member holding means is constituted by the fixed members 15A and 15B which are fixedly disposed on the base member 1 in the transverse direction (Y direction) being at a right angle to the substrate transporting direction along outer edges of the substrate mounting portion, as well as the supporting members 18 for supporting both end portions of the guide members 13. Further, the bolts 19 and the threaded holes 15b arranged at equal pitches in the fixed members 15A and 15B serve as fitting means for fitting the plurality of supporting members 18 to the fixed members 15A and 15B such that the interval in the transverse direction is adjustable.

As described above, in the plasma treatment apparatus shown in this embodiment, as a guide mechanism for guiding the side end surfaces of the substrate 11 on the substrate mounting portion whose upper surface is covered with the ceramic, the both end portions of the bar-shaped ceramic-made movable guides 13 arranged in a plurality of rows on the substrate mounting portion are supported by the supporting members 18. Further, the arrangement provided is such that the supporting members 18 are fitted to the fixed members 15A and 15B fixedly disposed along the substrate mounting portion at a right angle to the substrate transporting direction, such that the interval is adjustable.

As a result, even in cases where thin-type and deflectable resin substrates are used as objects to be treated, since the substrates are mounted on the ceramic-made members, the generation of an abnormal discharge is suppressed, and the quality of plasma treatment can be stabilized. Further, the ceramic-made movable guides 13, which are movable in the transverse direction in correspondence with the substrate size, are held by the fixed members 15A and 15B by means of the supporting members 18. Accordingly, it becomes possible to mount and demount the movable guides made of a material which is brittle and easy to break, without requiring bolting and in correspondence with the substrate size. As a result, it is possible to realize a substrate guiding mechanism which is capable of effectively preventing an abnormal discharge by using thin-type substrates as objects without incurring an increase in cost entailed by the replacement of the ceramic-made substrate mounting portion for each product type of the substrate.

This application is based upon and claims the benefit of priority of Japanese Patent Application No. 2005-037153 filed on Feb. 15, 2005, the contents of which are incorporated herein by reference in its entirety.

INDUSTRIAL APPLICABILITY

The plasma treatment apparatus in accordance with the invention exhibits an advantage in that it is capable of preventing the generation of an abnormal discharge by using multiple product thin-type substrates having different widthwise dimensions, and the plasma treatment apparatus in accordance with the invention is applicable to a plasma treatment apparatus for performing surface etching treatment and the like by using thin-type substrates such as resin substrates as objects.

The invention claimed is:

1. A plasma treatment apparatus for plasma treating a surface of a substrate in a treatment chamber, comprising:
   a base portion which forms a bottom portion of the treatment chamber;
   a box shaped member with its lower surface side open and a lower end portion abuts against a base surface on top of the base portion so as to form the treatment chamber;
   an electrode section which is fitted on the base portion through an insulator and whose upper surface is exposed in the treatment chamber;
   a substrate mounting portion which constitutes an upper portion of the electrode section and whose upper surface is covered with a ceramic;
   plasma generating means for generating plasma for plasma treatment in the treatment chamber;
   a plurality of bar-shaped ceramic guide members which are disposed on the upper surface of the substrate mounting portion along a substrate transporting direction and are adapted to guide side end surfaces of the substrate mounted on the substrate mounting portion; and
   guide member holding means for holding longitudinal both end portions of the guide members,
   wherein the guide member holding means includes:
      a pair of fixed members which are fixedly disposed on the base portion in a transverse direction being at a right angle to the substrate transporting direction along outer edges of the substrate mounting portion,
      a plurality of supporting members for supporting the both end portions of the guide members, wherein the supporting members are positioned in the substrate transporting direction by the fixed members, and
      fitting means for fitting the plurality of supporting members to the fixed members such that the interval in the transverse direction is adjustable,
   wherein positioning pins are protruded upwardly on the supporting members, and positioning holes are formed in the guide members, and
   wherein the guide members are mounted on the supporting members by fitting the positioning pins upwardly in the positioning holes.

2. A plasma treatment apparatus for plasma treating a surface of a substrate in a treatment chamber, comprising:
   a base portion which forms a bottom portion of the treatment chamber;
   a box shaped member with its lower surface side open and a lower end portion abuts against a base surface on top of the base portion so as to form the treatment chamber;
   an electrode section which is fitted on the base portion through an insulator and whose upper surface is exposed in the treatment chamber;

a substrate mounting portion which constitutes an upper portion of the electrode section and whose upper surface is covered with a ceramic;
plasma generating means for generating plasma for plasma treatment in the treatment chamber;
a plurality of bar-shaped ceramic guide members which are disposed on the upper surface of the substrate mounting portion along a substrate transporting direction and are adapted to guide side end surfaces of the substrate mounted on the substrate mounting portion; and
guide member holding means for holding longitudinal both end portions of the guide members,
wherein the guide member holding means includes:
  a pair of fixed members which are fixedly disposed on the base portion in a transverse direction being at a right angle to the substrate transporting direction along outer edges of the substrate mounting portion,
  a plurality of supporting members for supporting the both end portions of the guide members, wherein the supporting members are positioned in the substrate transporting direction by the fixed members, and
  fitting means for fitting the plurality of supporting members to the fixed members such that the interval in the transverse direction is adjustable,
wherein a plurality of groove portions are formed on an upper surface of the substrate mounting portion along the substrate transporting direction by cutting the substrate mounting surface, and
a projecting portion of a projecting dimension smaller than a depthwise dimension of the groove portions and a notched portion formed by notching a bottom of each of the guide members formed in a shape a rectangular bar with a notching dimension larger than a widthwise dimension of the substrate are formed continuously in a longitudinal direction on the bottom of each of the rectangular bar-shaped guide members, a side end portion of the substrate mounted on the substrate mounting surface being guided by the notched portion in a state in which the guide member is placed on the substrate mounting surface by advancing the projecting portion into the groove portion.

3. The plasma treatment apparatus according to claim 1, wherein the guide members are mounted on the supporting members by the own weight of the guide members without effecting bolting.

\* \* \* \* \*